(12) United States Patent
Zhang et al.

(10) Patent No.: US 10,002,745 B2
(45) Date of Patent: Jun. 19, 2018

(54) PLASMA TREATMENT PROCESS FOR IN-SITU CHAMBER CLEANING EFFICIENCY ENHANCEMENT IN PLASMA PROCESSING CHAMBER

(71) Applicant: Applied Materials, Inc., Santa Clara, CA (US)

(72) Inventors: Lin Zhang, San Jose, CA (US); Xuesong Lu, Santa Clara, CA (US); Andrew V. Le, San Jose, CA (US); Jang Seok Oh, Suwon (KR); Xinhai Han, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days. days.

(21) Appl. No.: 15/145,750

(22) Filed: May 3, 2016

(65) Prior Publication Data
US 2017/0323768 A1    Nov. 9, 2017

(51) Int. Cl.
*H01J 37/32* (2006.01)

(52) U.S. Cl.
CPC .. *H01J 37/32082* (2013.01); *H01J 37/32862* (2013.01); *H01J 2237/334* (2013.01); *H01J 2237/335* (2013.01)

(58) Field of Classification Search
None
See application file for complete search history.

(56) References Cited

U.S. PATENT DOCUMENTS

| | | | | |
|---|---|---|---|---|
| 5,788,799 | A * | 8/1998 | Steger | B08B 7/0042 134/1.1 |
| 6,443,165 | B1 * | 9/2002 | Akahori | C23C 16/4405 134/1.1 |
| 7,150,796 | B2 * | 12/2006 | Smith | C23C 16/4405 134/1.1 |
| 2002/0073922 | A1 * | 6/2002 | Frankel | C23C 16/401 118/715 |
| 2003/0010355 | A1 | 1/2003 | Nowak et al. | |
| 2004/0077511 | A1 | 4/2004 | Barnes et al. | |

(Continued)

FOREIGN PATENT DOCUMENTS

JP        2001335937 A     12/2001

OTHER PUBLICATIONS

International Search Report and Written Opinion for PCT/US2017/027020 dated Jul. 25, 2017.

*Primary Examiner* — Allan Olsen
(74) *Attorney, Agent, or Firm* — Patterson+Sheridan, LLP

(57) ABSTRACT

Embodiments of the disclosure include methods for in-situ chamber cleaning efficiency enhancement process for a plasma processing chamber utilized for a semiconductor substrate fabrication process. In one embodiment, a method for performing a plasma treatment process after cleaning a plasma process includes performing a cleaning process in a plasma processing chamber in absent of a substrate disposed thereon, subsequently supplying a plasma treatment gas mixture including at least a hydrogen containing gas and/or an oxygen containing gas into the plasma processing chamber, applying a RF source power to the processing chamber to form a plasma from the plasma treatment gas mixture, and plasma treating an interior surface of the processing chamber.

17 Claims, 2 Drawing Sheets

(56) References Cited

U.S. PATENT DOCUMENTS

| | | | |
|---|---|---|---|
| 2006/0093756 A1* | 5/2006 | Rajagopalan | C23C 16/4404 427/569 |
| 2007/0163617 A1* | 7/2007 | Ozaki | B08B 7/0035 134/1.1 |
| 2007/0238199 A1* | 10/2007 | Yamashita | B08B 7/00 438/5 |
| 2008/0075888 A1* | 3/2008 | Rajagopalan | C23C 16/4404 427/579 |
| 2008/0185284 A1* | 8/2008 | Chen | H01J 37/321 204/164 |
| 2008/0188087 A1* | 8/2008 | Chen | C23C 16/507 438/758 |
| 2011/0226734 A1* | 9/2011 | Sumiya | H01J 37/32192 216/41 |
| 2012/0040536 A1 | 2/2012 | Furuta et al. | |
| 2013/0087174 A1 | 4/2013 | Sun et al. | |

* cited by examiner

PLASMA TREATMENT PROCESS FOR IN-SITU CHAMBER CLEANING EFFICIENCY ENHANCEMENT IN PLASMA PROCESSING CHAMBER

BACKGROUND

Field

Embodiments of the present disclosure generally relate to methods and apparatus for in-situ enhancing cleaning efficiency of a plasma processing chamber. Particularly, embodiments of the present disclosure relate to methods and apparatus for a plasma treatment process performed to in-situ enhance cleaning efficiency of a plasma processing chamber after a plasma process.

Description of the Related Art

Semiconductor processing involves a number of different chemical and physical processes whereby minute integrated circuits are created on a substrate. Layers of materials which make up the integrated circuit are created by chemical vapor deposition, physical vapor deposition, epitaxial growth, chemical treatment, electrochemical process and the like. Some of the layers of material are patterned using photoresist masks and wet or dry etching techniques. The substrate utilized to form integrated circuits may be silicon, gallium arsenide, indium phosphide, glass, or other appropriate material.

A typical semiconductor processing chamber includes a chamber body defining a process zone, a gas distribution assembly adapted to supply a gas from a gas supply into the process zone, a gas energizer, e.g., a plasma generator, utilized to energize the process gas to process a substrate positioned on a substrate support assembly, and a gas exhaust. During plasma processing, the energized gas is often comprised of ions, radicals and highly reactive species which etches and erodes exposed portions of the processing chamber components, for example, an electrostatic chuck that holds the substrate during processing. Additionally, processing by-products are often deposited on chamber components which must be periodically cleaned typically with highly reactive fluorine. Accordingly, in order to maintain cleanliness of the processing chamber, a periodic cleaning process is performed to remove the by-products from the processing chamber. By-products deposited on chamber components or chamber inner walls are periodically cleaned typically with highly reactive chemicals. Attack from the reactive species during processing and cleaning reduces the lifespan of the chamber components and increase service frequency. Additionally, flakes, such as aluminum fluoride (AlF), from the eroded parts of the chamber component may become a source of particulate contamination during substrate processing. Furthermore, $AlF_3$ formed on a relatively high temperature component surface during cleaning process could sublimate but later deposit on a relatively low temperature chamber component surface, such as showerhead, after the cleaning process. This residual deposit can result in premature chamber component failure and frequent chamber maintenance. Therefore, promoting plasma resistance of chamber components and reducing damage to the chamber component during processing and cleaning are desirable to increase service life of the processing chamber, reduce chamber downtime, reduce maintenance frequency, and improve product yields.

Therefore, there is a need for an improved process for maintaining cleanliness of the processing chamber as well as the integrity of the chamber components to increase the lifetime of chamber components.

SUMMARY

Embodiments of the disclosure include methods for in-situ chamber cleaning efficiency enhancement process for a plasma processing chamber utilized for a semiconductor substrate fabrication process. In one embodiment, a method for performing a plasma treatment process after cleaning a plasma process includes performing a cleaning process in a plasma processing chamber in absent of a substrate disposed therein, subsequently supplying a plasma treatment gas mixture including at least a hydrogen containing gas and/or an oxygen containing gas into the plasma processing chamber, applying a RF source power to the processing chamber to form a plasma from the plasma treatment gas mixture, and plasma treating an interior surface of the processing chamber.

In another embodiment, a method for in-situ chamber cleaning includes performing a cleaning process in a plasma processing chamber in absent of a substrate disposed therein, in-situ performing a plasma treatment process in the processing chamber, and performing a seasoning process after the plasma treatment process in the processing chamber, wherein the cleaning process, plasma treatment process and the seasoning process are controlled by a single recipe integrated in the plasma processing chamber.

In yet embodiment, a method for performing a plasma treatment process after cleaning a plasma process includes supplying a cleaning gas mixture including a fluorine containing gas supplied form a remote plasma source in a plasma processing chamber, supplying a plasma treatment gas mixture including oxygen containing gas and hydrogen containing gas to form a plasma from a RF source power generated in the plasma treatment gas mixture to remove metal contaminants from an interior surface of the processing chamber, and supplying a seasoning film gas mixture to form a seasoning layer on the interior surface of the plasma processing chamber.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present disclosure provide methods and apparatus for enhancing cleaning efficiency of an in-situ cleaning process performed in a plasma processing chamber. In one example, the cleaning efficiency of a cleaning process may be enhanced by performing a plasma treatment process after the chamber cleaning process to remove process byproduct residuals from the processing chamber. One example of a plasma treatment gas mixture utilized during the plasma treatment includes a hydrogen containing gas mixture, such as $H_2$ gas, and/or an oxygen containing gas mixture. After the plasma treatment process, a seasoning process may be then performed to coat a seasoning layer on an interior surface of the processing chamber.

Figure 1:
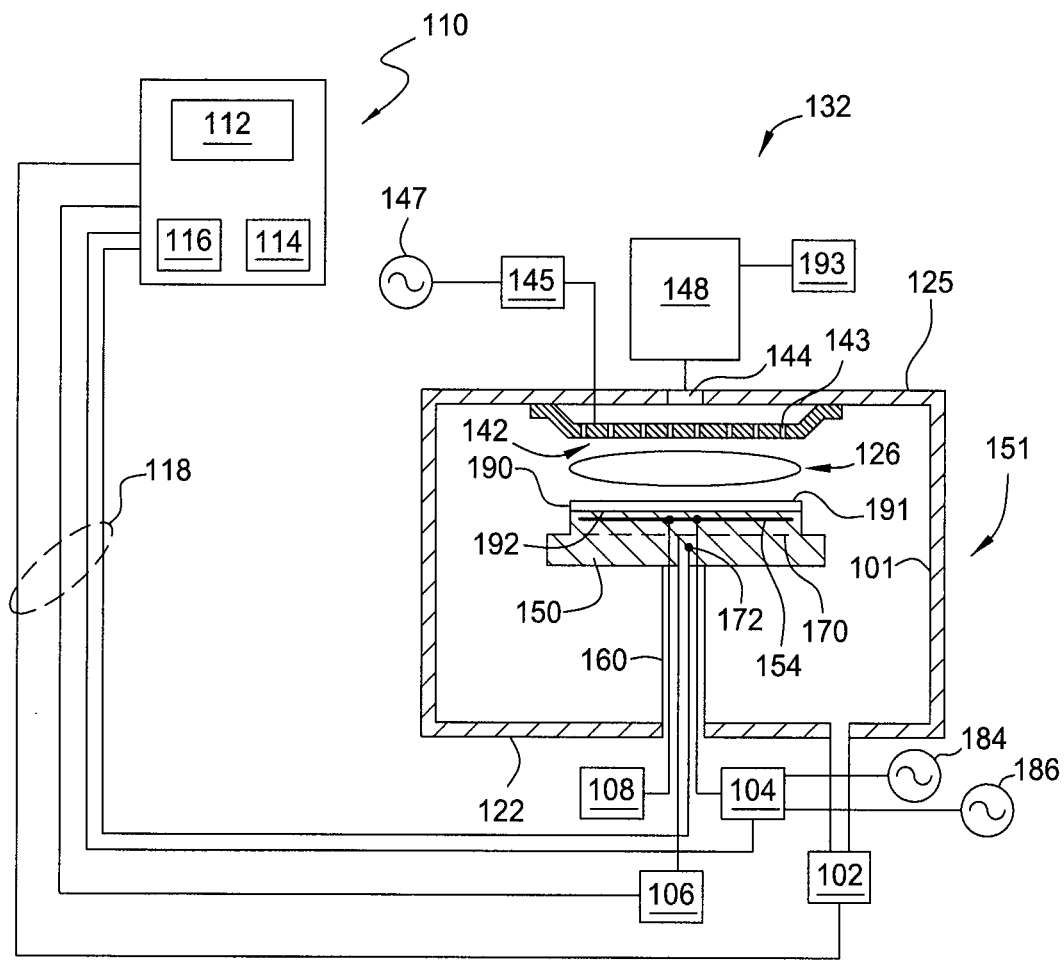
FIG. 1 depicts a schematic diagram of a plasma processing chamber for according to one embodiment of the disclosure.

FIG. 1 is a cross sectional view of a plasma processing system 132 suitable for performing a plasma process that may be utilized as semiconductor interconnection structures for semiconductor devices manufacture. The processing system 132 may be a suitably adapted CENTURA®, Producer® SE or Producer® GT or Producer® XP processing system available from Applied Materials, Inc., of Santa Clara, Calif. It is contemplated that other processing systems, including those produced by other manufacturers, may benefit from embodiments described herein.

The processing system 132 includes a chamber body 151. The chamber body 151 includes a lid 125, a sidewall 101 and a bottom wall 122 that define an interior volume 126.

A substrate support pedestal 150 is provided in the interior volume 126 of the chamber body 151. The pedestal 150 may be fabricated from aluminum, ceramic, aluminum nitride, and other suitable materials. In one embodiment, the pedestal 150 is fabricated by a ceramic material, such as aluminum nitride, which is a material suitable for use in a high temperature environment, such as a plasma process environment, without causing thermal damage to the pedestal 150. The pedestal 150 may be moved in a vertical direction inside the chamber body 151 using a lift mechanism (not shown).

The pedestal 150 may include an embedded heater element 170 suitable for controlling the temperature of a substrate 190 supported on the pedestal 150. In one embodiment, the pedestal 150 may be resistively heated by applying an electric current from a power supply 106 to the heater element 170. In one embodiment, the heater element 170 may be made of a nickel-chromium wire encapsulated in a nickel-iron-chromium alloy (e.g., INCOLOY®) sheath tube. The electric current supplied from the power supply 106 is regulated by the controller 110 to control the heat generated by the heater element 170, thereby maintaining the substrate 190 and the pedestal 150 at a substantially constant temperature during film deposition at any suitable temperature range. In another embodiment, the pedestal may be maintained at room temperature as needed. In yet another embodiment, the pedestal 150 may also include a chiller (not shown) as needed to cool the pedestal 150 at a range lower than room temperature as needed. The supplied electric current may be adjusted to selectively control the temperature of the pedestal 150 between about 100 degrees Celsius to about 700 degrees Celsius.

A temperature sensor 172, such as a thermocouple, may be embedded in the substrate support pedestal 150 to monitor the temperature of the pedestal 150 in a conventional manner. The measured temperature is used by the controller 110 to control the power supplied to the heater element 170 to maintain the substrate at a desired temperature.

The pedestal 150 generally includes a plurality of lift pins (not shown) disposed therethrough that are configured to lift the substrate 190 from the pedestal 150 and facilitate exchange of the substrate 190 with a robot (not shown) in a conventional manner.

The pedestal 150 comprises at least one electrode 192 for retaining the substrate 190 on the pedestal 150. The electrode 192 is driven by a chucking power source 108 to develop an electrostatic force that holds the substrate 190 to the pedestal surface, as is conventionally known. Alternatively, the substrate 190 may be retained to the pedestal 150 by clamping, vacuum or gravity.

In one embodiment, the pedestal 150 is configured as a cathode having the electrode 192 embedded therein coupled to at least one RF bias power source, shown in FIG. 1A as two RF bias power sources 184, 186. Although the example depicted in FIG. 1A shows two RF bias power sources 184, 186, it is noted that the numbers of the RF bias power sources may be any number as needed. The RF bias power sources 184, 186 are coupled between the electrode 192 disposed in the pedestal 150 and another electrode, such as a gas distribution plate 142 or ceiling 125 of the processing system 132. The RF bias power source 184, 186 excites and sustains a plasma discharge formed from the gases disposed in the processing region of the processing system 132.

In the embodiment depicted in FIG. 1, the dual RF bias power sources 184, 186 are coupled to the electrode 192 disposed in the pedestal 150 through a matching circuit 104. The signal generated by the RF bias power source 184, 186 is delivered through matching circuit 104 to the pedestal 150 through a single feed to ionize the gas mixture provided in the plasma processing system 132, thereby providing ion energy necessary for performing a deposition or other plasma enhanced process. The RF bias power sources 184, 186 are generally capable of producing an RF signal having a frequency of from about 50 kHz to about 200 MHz and a power between about 0 Watts and about 5000 Watts.

A vacuum pump 102 is coupled to a port formed in the bottom 122 of the chamber body 151. The vacuum pump 102 is used to maintain a desired gas pressure in the chamber body 151. The vacuum pump 102 also evacuates post-processing gases and by-products of the process from the chamber body 151.

The processing system 132 includes one or more gas delivery passages 144 coupled through the lid 125 of the processing system 132. The gas delivery passages 144 and the vacuum pump 102 are positioned at opposite ends of the processing system 132 to induce laminar flow within the interior volume 126 to minimize particulate contamination.

The gas delivery passage 144 is coupled to the gas panel 193 through a remote plasma source (RPS) 148 to provide a gas mixture into the interior volume 126. In one embodiment, the gas mixture supplied through the gas delivery passage 144 may be further delivered through a gas distribution plate 142 disposed below the gas delivery passage 144. In one example, the gas distribution plate 142 having a plurality of apertures 143 is coupled to the lid 125 of the chamber body 151 above the pedestal 150. The apertures 143 of the gas distribution plate 142 are utilized to introduce process gases from the gas panel 193 into the chamber body 151. The apertures 143 may have different sizes, number, distributions, shape, design, and diameters to facilitate the flow of the various process gases for different process requirements. A plasma is formed from the process gas mixture exiting the gas distribution plate 142 to enhance thermal decomposition of the process gases resulting in the deposition of material on the surface 191 of the substrate 190.

The gas distribution plate 142 and substrate support pedestal 150 may be formed a pair of spaced apart electrodes in the interior volume 126. One or more RF sources 147 provide a bias potential through a matching network 145 to the gas distribution plate 142 to facilitate generation of a plasma between the gas distribution plate 142 and the pedestal 150. Alternatively, the RF sources 147 and matching network 145 may be coupled to the gas distribution plate 142, substrate support pedestal 150, or coupled to both the gas distribution plate 142 and the substrate support pedestal 150, or coupled to an antenna (not shown) disposed exterior to the chamber body 151. In one embodiment, the RF sources 147 may provide between about 10 Watts and about 3000 Watts at a frequency of about 30 kHz to about 13.6 MHz. Alternatively, the RF source 147 may be a microwave generator that provide microwave power to the gas distribution plate 142 that assists generation of the plasma in the interior volume 126.

Examples of gases that may be supplied from the gas panel 193 may include a silicon containing gas, fluorine continuing gas, oxygen containing gas, hydrogen containing gas inert gas and carrier gases. Suitable examples of the reacting gases includes a silicon containing gas, such as $SiH_4$, $Si_2H_6$, $SiF_4$, $SiH_2Cl_2$, $Si_4H_{10}$, $Si_5H_{12}$, TEOS and the like. Suitable carrier gas includes nitrogen ($N_2$), argon (Ar), hydrogen ($H_2$), alkanes, alkenes, helium (He), oxygen ($O_2$), ozone ($O_3$), water vapor ($H_2O$), and the like.

In one embodiment, the remote plasma source (RPS) 148 may be alternatively coupled to the gas delivery passages 144 to assist in forming a plasma from the gases supplied from the gas panel 193 into the in the interior volume 126. The remote plasma source 148 provides plasma formed from the gas mixture provided by the gas panel 193 to the processing system 132.

The controller 110 includes a central processing unit (CPU) 112, a memory 116, and a support circuit 114 utilized to control the process sequence and regulate the gas flows from the gas panel 193. The CPU 112 may be of any form of a general purpose computer processor that may be used in an industrial setting. The software routines can be stored in the memory 116, such as random access memory, read only memory, floppy, or hard disk drive, or other form of digital storage. The support circuit 114 is conventionally coupled to the CPU 112 and may include cache, clock circuits, input/output systems, power supplies, and the like. Bi-directional communications between the controller 110 and the various components of the processing system 132 are handled through numerous signal cables collectively referred to as signal buses 118, some of which are illustrated in FIG. 1.

Figure 2:
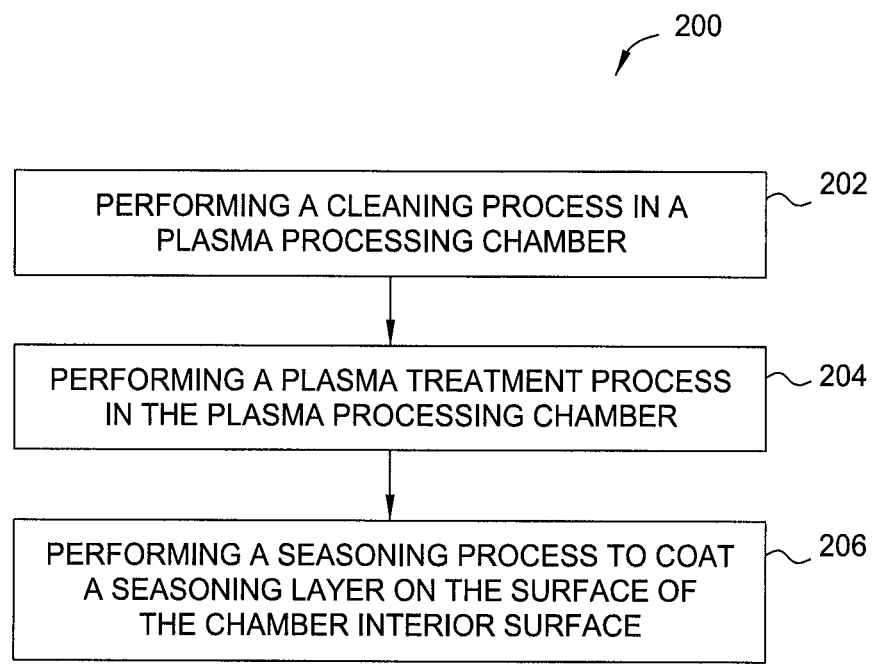
FIG. 2 depicts a flow chart of a method for performing a plasma treatment process after a cleaning process according to one embodiment of the disclosure.

FIG. 2 illustrates a method 200 for enhancing a cleaning efficiency after cleaning a plasma processing chamber, such as the plasma processing system 132 depicted in FIG. 1. The method 200 includes an in-situ chamber cleaning process that may integrate the cleaning efficiency enhancement process in a single cleaning step (e.g., a single cleaning recipe) according to embodiments of the present disclosure.

The method 200 begins at operation 202 by performing a cleaning process in the plasma processing chamber. After the plasma processing system 132 may be idled for a period of time or after a plasma process (including a deposition, etching, sputtering, or any plasma associated process) is performed in the plasma processing system 132, a cleaning process may be performed to remove chamber residuals or other contaminants. As the interior of the plasma processing chamber, including chamber walls, substrate pedestal, or other components disposed in the plasma processing system 132, may have film accumulation, by-products or contamination present thereon left over from the previous plasma processes, or flakes that have fallen of chamber inner walls while idling or plasma processing, the cleaning process may be performed to clean the interior surfaces of the plasma processing chamber after a substrate is removed from the processing system 132, or prior to providing a substrate into the plasma processing chamber for subsequent processing.

The cleaning process removes contaminates and/or film accumulated from the interior of the plasma processing chamber, thus preventing unwanted particles from falling on to the substrate disposed on the substrate pedestal during the subsequent plasma processes. While performing the cleaning process at operation 202, no substrate is present in the plasma processing system 132, e.g., in absence of a substrate disposed therein. The cleaning process is primarily performed to clean chamber components or inner wall/structures in the plasma processing system 132. In some cases, a dummy substrate, such as a clean silicon substrate without film stack disposed thereon, may be disposed in the processing chamber to protect the surface of the substrate pedestal as needed.

In one example, the cleaning process is performed by supplying a cleaning gas mixture to the processing system 132 to clean the interior of the plasma processing chamber. The cleaning gas mixture includes at least a fluorine containing gas and an inert gas. In one embodiment, the fluorine containing gas as used in the cleaning gas mixture may be selected from a group consisting of $NF_3$, $SF_6$, HF, $CF_4$, and the like. The inert gas may be He or Ar and the like. In one example, the fluorine containing gas supplied in the cleaning gas mixture is $NF_3$ gas and the inert gas is Ar.

During the cleaning process at operation 202, several process parameters may be controlled. In one embodiment, the remote plasma source (the RPS source 148 depicted in FIG. 1) may be supplied to the plasma processing system 132 between about 5000 Watt and about 20000 Watt, such as about 10000 Watts. The RPS power may be may be applied to the processing chamber with or without RF source and bias power. The pressure of the processing chamber may be controlled at a pressure range less than 10 Torr, such as between about 0.1 Torr and about 10 Torr, such as about 4 Torr. It is believed that the low pressure control during the cleaning process may enable the spontaneity of cleaning reaction.

The fluorine containing gas supplied in the cleaning gas mixture may be supplied into the processing chamber at a flow rate between about 1 sccm and about 12000 sccm, for example about 2800 sccm. The inert gas supplied in the cleaning gas mixture may be supplied into the processing chamber at a flow rate between about 1 sccm to about 300 sccm, for example about 500 sccm.

At operation 204, after the cleaning process at operation 202, a plasma treatment process is then performed to remove residuals remained in the processing system 132 prior to another cycle of the plasma process performed in the processing chamber. As discussed above, unwanted residuals from the cleaning process, such as chamber flakes resulted from over-cleaning of the chamber components, may be generated or remained in the processing chamber. The plasma treatment process at operation 204 may be performed to assist removing such residuals, particularly aluminum fluoride ($AlF_3$), or other contaminants from the processing system 132 to enhance cleanliness of the processing system 132.

Experimental results indicated that the hydrogen and oxygen elements, particularly hydrogen element, from the plasma treatment gas mixture assist reacting with metal containing contaminates, such as aluminum fluoride ($AlF_3$), present in the processing chamber, so as to efficiently remove such metal containing contaminates from the interior of the plasma processing chamber.

A plasma formed from a plasma treatment gas mixture is used to plasma treat interior surfaces of the processing system 132 to efficiently react with aluminum fluoride ($AlF_3$) or other sources of contamination. The contaminants, such as $AlF_3$, is energized into an excited state, such as in radical forms, which may then easily react with plasma treatment gas mixture, forming volatile gas byproducts, such as $AlH_3$ or HF*, which is readily pumped out of the processing system 132. In one example, the plasma treatment gas mixture may include at least one hydrogen containing gas and/or an oxygen containing gas. In another example, the plasma treatment gas mixture may include alternatively supplying a hydrogen containing gas and an oxygen containing gas for a number of cycles to perform the plasma treatment process. When the hydrogen containing gas and the oxygen containing gas are alternatively supplied in the plasma treatment gas mixture, the hydrogen and the oxygen containing gas may be separately and individually supplied with or without an inert gas, such as He or Ar.

Suitable examples of the hydrogen containing gas $H_2$, $H_2O$, $NH_3$, $N_2H_2$, and the like. Suitable examples of the oxygen containing gas $O_2$, $H_2O$, $O_3$, $H_2O_2$, $N_2O$, $NO_2$, CO, $CO_2$ and the like. In one particular example, a carrier gas or an inert gas may also be supplied into the plasma treatment gas mixture. Suitable examples of the carrier gas include nitrogen ($N_2$), hydrogen ($H_2$), and the like and suitable examples of the inert gas include He or Ar.

In one particular example, the hydrogen containing gas used in the plasma treatment gas mixture is $H_2$ or $NH_3$. The oxygen containing gas used in the plasma treatment gas mixture is $N_2O$ or $O_2$. The carrier gas used in the plasma gas mixture is $N_2$ and the inert gas used in the plasma treatment gas mixture is Ar.

It is believed that hydrogen containing gas included in the plasma treatment gas mixture during the plasma treatment process provides a high amount of hydrogen elements that reacts with the fluorine elements in the metal containing contaminants, such as aluminum fluoride, forming volatile gas byproducts, such as $AlH_3$ or HF, which is readily pumped out of the processing system 132. Subsequently, volatile gas byproducts, such as $AlH_3$, may further be decomposed as Al* or and $H_2$ gas in the processing chamber. Furthermore, the oxygen elements from the oxygen containing gas may then react with the active metal contaminants, such as the aluminum active species (such as Al* or Ar), to form metal oxide, such as aluminum oxide ($Al_2O_3$), thus passivating a thin layer on the surfaces of the chamber components so as to prevent the surface of the chamber components from further damage or attack. Thus, by utilizing a plasma treatment gas mixture including at least a hydrogen containing gas and an oxygen containing gas, the interior surface of the processing chamber may be efficiently cleaned.

In some embodiments, an inert gas (such as Ar or He) or a carrier gas (such as $N_2$ or $N_2O$) may be supplied in the plasma treatment gas mixture. It is believed that the inert gas supplied in the plasma treatment gas mixture may assist increasing the life time of the ions in the plasma formed from the plasma treatment gas mixture. Increased life time of the ions may assist with reacting and activating the aluminum fluoride ($AlF_3$) or other source of contaminants more thoroughly, thereby enhancing the removal of the aluminum fluoride ($AlF_3$) or other source of contaminants from the processing system 132.

During the plasma treatment process at operation 204, several process parameters may be controlled. In one embodiment, the RF source power, such as the power provided by RF source 147, may be supplied to the plasma processing system 132 between about 50 Watt and about 2500 Watt, such as about 750 Watts. The RF source power may be may be applied to the processing chamber with or without RPS power or RF source bias power. The pressure of the processing chamber may be controlled at a pressure range less than 10 Torr, such as between about 0.1 Torr and about 10 Torr, such as about 4.5 Torr.

The hydrogen containing gas supplied in the plasma treatment gas mixture may be supplied into the processing chamber at a flow rate between about 1 sccm and about 5000 sccm, for example about 700 sccm. The inert gas, such as Ar gas, supplied in the plasma treatment gas mixture may be supplied into the processing chamber at a flow rate between about 100 sccm to about 8000 sccm, for example about 3600 sccm. The carrier gas, such as $N_2$ gas, supplied in the plasma treatment gas mixture may be supplied into the processing chamber at a flow rate between about 100 sccm to about 5000 sccm, for example about 1500 sccm. The oxygen containing gas, such as $N_2O$ gas, supplied in the plasma treatment gas mixture may be supplied into the processing chamber at a flow rate between about 50 sccm to about 50000 sccm, for example about 11000 sccm. In one or more embodiments, the gases added to provide the plasma treatment gas mixture having at least a 1:30 ratio by flow volume of hydrogen containing gas to oxygen containing gas, such as the ratio between about 1:1 and 1:20, for example about 1:15.

It is noted that the amount of each gas introduced into the processing chamber may be varied and adjusted to accommodate, for example, the thickness or the amount of the chamber residuals to be removed, the geometry of the substrate being cleaned, the volume capacity of the plasma, the volume capacity of the chamber body, as well as the capabilities of the vacuum system coupled to the chamber body.

At operation 206, after the plasma treatment process at operation 204, a seasoning process may be performed. As discussed above, after one or more substrates have been processed in the processing system 132, typically, a cleaning process at operation 202 is performed to remove the deposition by-products deposited and accumulated in the chamber walls. After the chamber walls has been sufficiently cleaned by the cleaning gases, the plasma treatment process at operation 204 is performed to remove after clean byproduct (AlF) or other containment from the processing chamber to enhance the cleaning efficiency. After the cleaning by-products have been exhausted out of the chamber, a seasoning process at operation 206 is performed in the process chamber. The seasoning process is performed to deposit a seasoning film onto components of the chamber to seal the cleaned or roughened surface of the processing chamber components so as to reduce the contamination that may generate or flake off from the chamber wall during process.

The seasoning process comprises coating a material, such as the seasoning film, on the interior surfaces of the chamber in accordance with the subsequent deposition process recipe. In other words, the material of the seasoning film may be selected to have similar compositions, or film properties of the film subsequently deposited on the substrate. In one embodiment described herein, seasoning film coated on the interior surfaces of the processing chamber is a silicon oxide layer.

In one embodiment, the seasoning film may be deposited on the chamber interior surface using a deposition gas mixture substantially identical to the gas mixtures used in the following deposition processes performed in the plasma processing system 132 after the seasoning process. The process parameters for coating the seasoning film may or may not be the same as the subsequent deposition process to meet different process requirements. During the seasoning process, a silicon precursor gas, an oxygen or a nitrogen containing gas and an inert gas may be flown into the plasma processing system 132 where the RF bias power sources 147, 184, 186 provide radio frequency energy to activate the precursor gas and enables a season film deposition process.

In an exemplary embodiment wherein the deposition process is configured to deposit a silicon oxide film, a gas mixture including at least a silicon precursor, an oxygen containing gas and an inert gas, such as argon or a helium gas, may be supplied to the processing system 132 for seasoning film deposition. Silicon precursor as utilized may be $SiH_4$ gas or TEOS gas. Alternatively, in another exemplary embodiment wherein the deposition process is configured to deposition a silicon nitride film, a gas mixture including at least a silicon precursor, a nitrogen containing gas and an inert gas may be supplied to the processing system 132 for seasoning film deposition.

The RF power and gas flow rate may be adjusted to deposit the seasoning film with different silicon to oxide ratio, thereby providing a good adhesion to the subsequent to-be-deposited deposition film. Furthermore, the RF power and gas flow rate may be adjusted to control the deposition rate of the seasoning film, thereby efficiently depositing the seasoning film with a desired range of thickness to provide good protection and adhesion to the underlying chamber components, chamber parts and to-be-deposited. In one embodiment, the seasoning process may be performed for about 1 seconds to about 200 seconds to form a seasoning film having a thickness greater than 20000 Å.

Accordingly, methods and apparatus for performing an in-situ plasma treatment process after a cleaning process are provided to enhance cleaning efficiency of a plasma processing chamber without breaking vacuum. The methods includes a plasma treatment process utilizing a hydrogen containing gas and an oxygen containing gas to assist removing over-cleaning residuals or other sources of contaminants in the processing chamber and after a plasma cleaning process is performed but prior to a chamber seasoning process. The in-situ plasma treatment process may efficiently remove the residuals, including metal contaminants, such as AlF, from the interior of the plasma processing chamber, thereby maintaining the plasma processing chamber in a desired clean condition and producing high quality of semiconductor devices without particular pollution.

While the foregoing is directed to embodiments of the present disclosure, other and further embodiments of the disclosure may be devised without departing from the basic scope thereof, and the scope thereof is determined by the claims that follow.

The invention claimed is:

1. A method for performing a plasma treatment process after a plasma cleaning process, comprising:
performing a plasma cleaning process in a plasma processing chamber in the absence of a substrate disposed therein;
subsequently performing a post-clean plasma treatment process by supplying a plasma treatment gas mixture including at least a hydrogen containing gas and an oxygen containing gas into the plasma processing chamber, wherein the hydrogen containing gas and the oxygen containing gas are alternatively and individually supplied into the plasma processing chamber;
applying a RF source power to the processing chamber to form a plasma from the plasma treatment gas mixture; and
plasma treating an interior surface of the processing chamber; and
subsequently performing a seasoning process after plasma treating the interior surface of the processing chamber.

2. The method of claim 1, wherein the hydrogen containing gas supplied in the plasma treatment gas mixture includes $H_2$, $H_2O$, $NH_3$ or $N_2H_2$.

3. The method of claim 1, wherein the oxygen containing gas is selected from a group consisting of $O_2$, $H_2O$, $N_2O$, $NO_2$, $O_3$, CO and $CO_2$.

4. The method of claim 1, wherein the hydrogen containing gas and the oxygen containing gas are supplied at a flow ratio of between about 1:1 and about 1:20.

5. The method of claim 1, wherein the hydrogen containing gas is $NH_3$ or $H_2$ and the oxygen containing gas is $N_2O$.

6. The method of claim 1, wherein performing the seasoning process further comprises:
forming a silicon containing seasoning film on the interior surface of the processing chamber.

7. The method of claim 1, wherein performing the cleaning process further comprises:
supplying a fluorine containing gas to the processing chamber for cleaning.

8. The method of claim 7, wherein supplying the fluorine containing gas further comprises:
generating a remote plasma from the fluorine containing gas prior to delivering to the processing chamber.

9. The method of claim 1, wherein plasma treating the interior surface of the processing chamber further comprises:
reacting metal containing contaminants with the hydrogen containing gas supplied from the plasma treatment gas mixture.

10. The method of claim 9, wherein reacting the metal containing contaminants with the hydrogen containing gas further comprises:
forming an metal oxide on the interior surface by the oxygen containing gas from the plasma treatment gas mixture of the processing chamber.

11. The method of claim 10, wherein the metal oxide is $Al_2O_3$.

12. The method of claim 9, wherein the metal containing contaminants is AlF.

13. A method for performing a plasma treatment process after a plasma cleaning process, comprising:
performing a cleaning process in a plasma processing chamber in the absence of a substrate disposed therein;
in-situ performing a plasma treatment process in the processing chamber by supplying a plasma treatment gas mixture including at least a hydrogen containing gas and an oxygen containing gas into the plasma processing chamber, wherein the hydrogen containing gas and the oxygen containing gas are alternatively and individually supplied into the plasma processing chamber; and
performing a seasoning process after the plasma treatment process in the processing chamber, wherein the cleaning process, plasma treatment process and the seasoning process are controlled by a single recipe having multiple steps integrated in the plasma processing chamber.

14. The method of claim 13, wherein the plasma treatment gas mixture includes $N_2O$, $N_2$, and $NH_3$ or $H_2$.

15. The method of claim 13, wherein the treatment process is performed by generating a plasma by a RF source power generated from the plasma treatment gas mixture.

16. The method of claim 13, wherein the plasma treatment process is performed to remove aluminum fluoride from the processing chamber.

17. A method for performing a plasma treatment process after cleaning a plasma process, comprising:
  supplying a cleaning gas mixture including a fluorine containing gas supplied from a remote plasma source in a plasma processing chamber in the absence of a substrate;
  subsequently supplying a plasma treatment gas mixture including oxygen containing gas and hydrogen containing gas to form a plasma from a RF source power generated in the plasma treatment gas mixture to remove metal contaminants from an interior surface of the processing chamber, wherein the hydrogen containing gas and the oxygen containing gas are alternatively and individually supplied into the plasma processing chamber; and
  subsequently supplying a seasoning film gas mixture to form a seasoning layer on the interior surface of the plasma processing chamber.

* * * * *